United States Patent
Eiles et al.

(10) Patent No.: US 9,651,610 B2
(45) Date of Patent: May 16, 2017

(54) VISIBLE LASER PROBING FOR CIRCUIT DEBUG AND DEFECT ANALYSIS

(71) Applicants: Travis M. Eiles, Beaverton, OR (US); Rajiv Giridharagopal, Portland, OR (US); David Shykind, Buxton, OR (US)

(72) Inventors: Travis M. Eiles, Beaverton, OR (US); Rajiv Giridharagopal, Portland, OR (US); David Shykind, Buxton, OR (US)

(73) Assignee: Intel Corporation, Santa Clara, CA (US)

(*) Notice: Subject to any disclaimer, the term of this patent is extended or adjusted under 35 U.S.C. 154(b) by 286 days.

(21) Appl. No.: 13/931,869

(22) Filed: Jun. 29, 2013

(65) Prior Publication Data
US 2015/0002182 A1    Jan. 1, 2015

(51) Int. Cl.
*G01R 31/28*    (2006.01)
*G01R 31/265*   (2006.01)

(52) U.S. Cl.
CPC ................ *G01R 31/2656* (2013.01)

(58) Field of Classification Search
CPC ............ G01R 31/2851; G01R 31/2656; G01R 31/002; G01R 31/2882; G01R 31/309; G01R 31/311; G01R 31/3177; H01L 22/10; H01L 22/12; H01L 22/14; G01N 21/636; G01N 21/1717; G01N 21/9501
See application file for complete search history.

(56) References Cited

U.S. PATENT DOCUMENTS

| | | | | |
|---|---|---|---|---|
| 4,652,757 A * | 3/1987 | Carver | ........................ | 250/360.1 |
| 5,821,549 A * | 10/1998 | Talbot et al. | ................... | 850/62 |
| 6,072,179 A * | 6/2000 | Paniccia et al. | ........... | 250/341.4 |
| 6,366,101 B1 * | 4/2002 | Bruce | ................... | G01R 31/311 |
| | | | | 324/754.23 |
| 6,405,359 B1 * | 6/2002 | Tseng | ................... | G01R 31/311 |
| | | | | 438/118 |
| 6,480,641 B1 * | 11/2002 | Ding | ....................... | G02F 1/218 |
| | | | | 359/248 |
| 6,483,326 B1 * | 11/2002 | Bruce | ................ | G01R 31/2851 |
| | | | | 257/E21.525 |
| 7,154,287 B2 * | 12/2006 | Song | .................... | G01R 31/311 |
| | | | | 324/750.3 |
| 7,291,508 B2 * | 11/2007 | Ortega | ........................... | 438/16 |
| 7,659,981 B2 * | 2/2010 | Lo | ........................ | G01R 31/307 |
| | | | | 356/369 |

(Continued)

*Primary Examiner* — Huy Q Phan
*Assistant Examiner* — David Frederiksen
(74) *Attorney, Agent, or Firm* — Blakely, Sokoloff, Taylor & Zafman LLP

(57) ABSTRACT

Visible laser probing is described. In one example a probe device has a laser configured to provide a laser beam at a visible wavelength, an objective lens positioned in front of the laser to focus the laser beam on an active region of an integrated circuit through a back side of an integrated circuit die, and a detector positioned to receive a reflected laser beam reflected from the active region through a back side of the die, through the objective lens. The detector is configured to detect an amplitude modulation of the reflected laser beam wherein the amplitude modulation is attributable to the electric field at the active region.

20 Claims, 10 Drawing Sheets

(56) References Cited

U.S. PATENT DOCUMENTS

| | | | |
|---|---|---|---|
| 2004/0013154 A1* | 1/2004 | Zheng | H01S 5/041 372/96 |
| 2004/0253751 A1* | 12/2004 | Salnik et al. | 438/16 |
| 2005/0036136 A1* | 2/2005 | Opsal et al. | 356/237.2 |
| 2007/0097370 A1* | 5/2007 | Chism | G01N 21/1717 356/432 |
| 2008/0123699 A1* | 5/2008 | Lee | H01S 5/026 372/22 |
| 2011/0075153 A1* | 3/2011 | Hogan | 356/491 |
| 2011/0216312 A1* | 9/2011 | Matsumoto et al. | 356/237.1 |
| 2014/0149811 A1* | 5/2014 | Ross et al. | 714/724 |

* cited by examiner

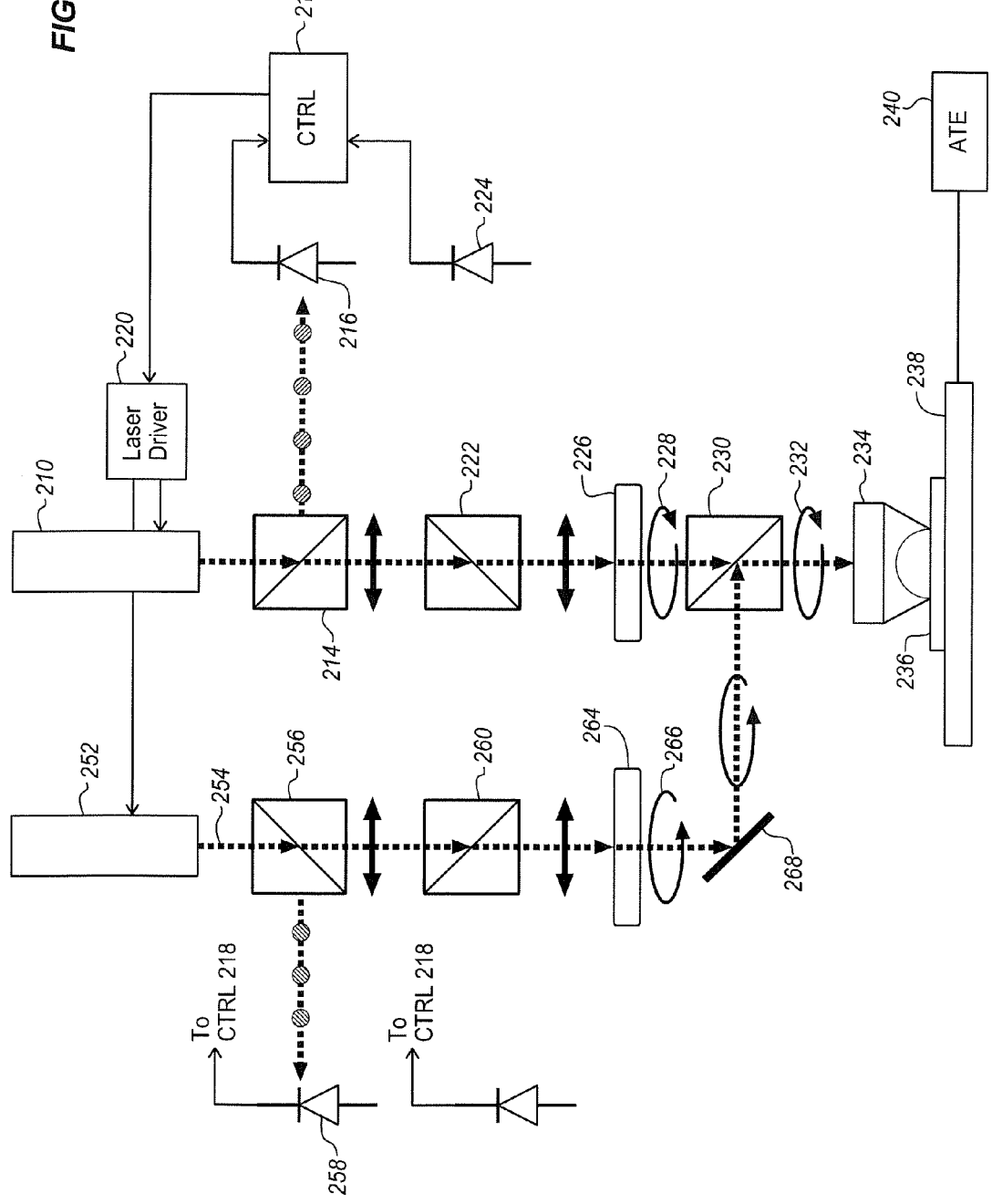

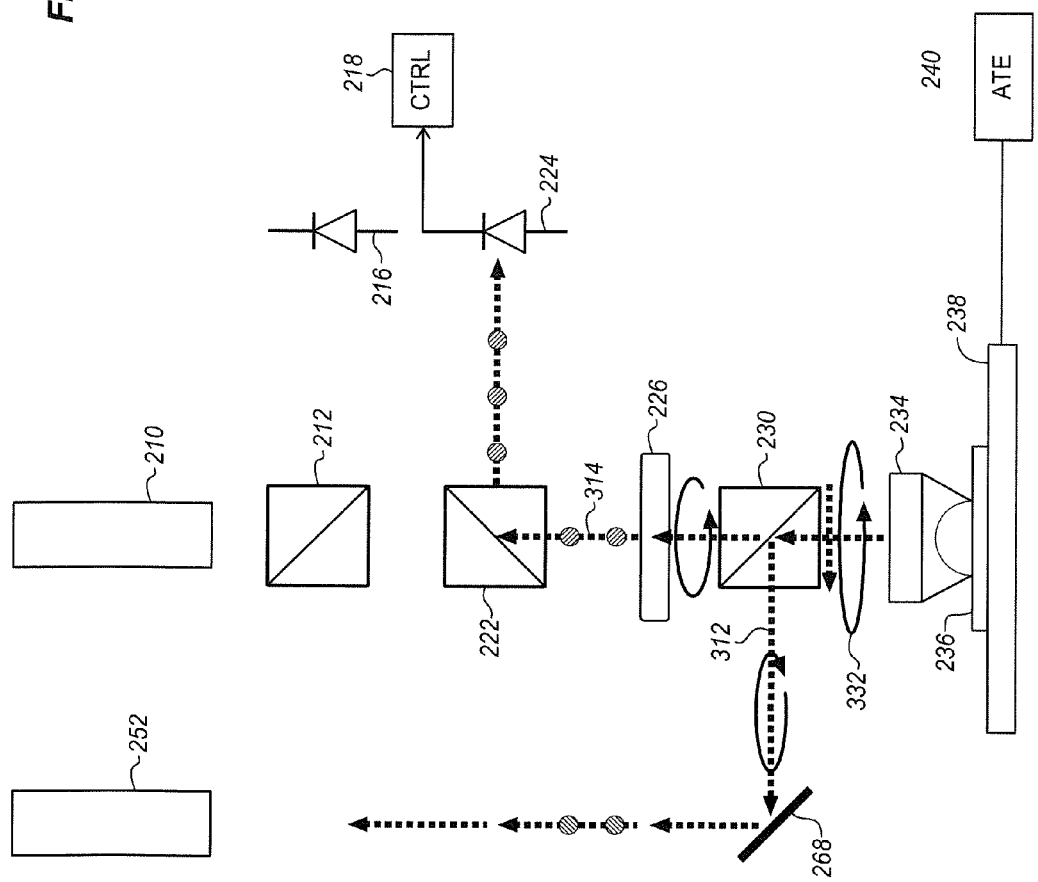

VISIBLE LASER PROBING FOR CIRCUIT DEBUG AND DEFECT ANALYSIS

FIELD

The present disclosure relates to the field of integrated circuit test and analysis and, in particular to laser voltage probing.

BACKGROUND

Integrated circuits can be very complex and subject to a variety of different failures caused by flaws in the manufacturing process. Accordingly, they are thoroughly tested before being sold. Testing equipment is also used during development to ensure that a theoretical design performs well in practice and to ensure that the manufacturing processes are producing functional parts. During test and debug processes, probes are applied to various nodes that are on the surface or near the surface of the integrated circuit. The probes measure electrical characteristics of the integrated circuit at different locations. The measured device parameters may include voltage levels, timing information, current levels and thermal information.

While there are many possibilities for directly probing the metal interconnects on a chip. Laser probing allows even more data to be collected without affecting the operation of the chip. A laser beam is focused through the back side of the silicon of a DUT (Device Under Test). The beam is reflected from active regions of the DUT and directed to a detector. By measuring the changes in the amplitude of the reflected beam, the detector indicates changes in the charges within a PN junction region under the probe caused by the operation of the P-N junction region. Using repeated measurements, high frequency voltage waveforms from the P-N junction region can also be measured. In some cases a part of the probe laser is reflected from a metal region and used as a reference to compare with the light reflected from the P-N junction.

Laser voltage probing allows circuits to be probed without contact and it allows circuits that are buried below several silicon layers to be probed. The amplitude difference measured by the detector is caused by a change in the charge concentration in a P/N junction of, for example, a transistor during operation.

The amount of the laser beam absorbed by the P/N junction changes as the electric field within the P/N junction changes. The electric field is determined by the electric charge within the junction. As the absorption changes, the amount of light reflected back from the junction changes. The changes in the reflected light can be used to characterize the charge and therefore, the electric field, and therefore the voltage at the junction.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 2A is a diagram of transmitted light with a two laser LVP test fixture according to an embodiment.

FIG. 2C is a diagram of received visible light with the two laser LVP test fixture of FIG. 2A according to an embodiment.

DETAILED DESCRIPTION

Infrared light lasers are typically used for optical diagnostics and analysis of flip-chip mounted integrated circuits (IC's) and other types of IC's. The infrared laser penetrates through silicon allowing signals to be collected for fault isolation and circuit debugging. While the silicon substrate is largely transparent to the infrared light, the long wavelength also limits the spatial resolution. In order to increase the resolution, higher numerical apertures (NA) are used in the microscope optics. While high-NA dry objectives have been used for larger circuit elements, liquid immersion lenses and solid immersion lenses (SIL) are used for circuits with smaller elements. However, there are physical limits to the NA of a lens including a solid immersion lens.

In order to increase the resolution further and allow still smaller features to be probed, shorter wavelength light may be used. A visible wavelength laser in the range below 700 nm together with a compatible high-NA SIL can provide a laser spot diameter that is less than or equal to about half of the laser spot diameter provided by a wavelength of 1064 nm and a 3.0 NA SIL. Such a system may be used in a laser scanning microscope system for LADA (Laser Assisted Device Alteration) and for waveform probing, among other applications.

Silicon is more opaque to visible light than to infrared light so the shorter wavelength of a visible light laser does not penetrate silicon as far as the infrared lasers do. The absorption of the visible wavelength light in silicon limits the distance that light and its reflection may travel and still be detected at the detector to about 400 to 800 nm. This may be overcome using silicon substrates that are much thinner. While the entire substrate may be made thinner, the thinning may also be limited to local regions. The local regions may be any desired size, depending on how the laser is used. In one example, areas of about 100 μm×100 μm may be used for laser probe scanning.

In addition, a different SIL tip may be used for the shorter wavelength. Si and GaAs (Gallium Arsenide), common for infrared light, may not be sufficiently transparent for visible light. GaP (Gallium Phosphide) is a material that combines transmission at 550 nm and above with a high refractive index of about 3.0 and reasonably small amounts of birefringence. Diamond is also a suitable material with a refractive index of about 2.5. The high refractive index is an important factor in obtaining a high numerical aperture.

The systems and techniques described herein provide a smaller laser spot size leading to better imaging resolution and lower crosstalk between adjacent devices in the device under test. This difference arises from the shorter wavelengths of the visible wavelengths of light, as compared with infrared beams.

Figure 1:
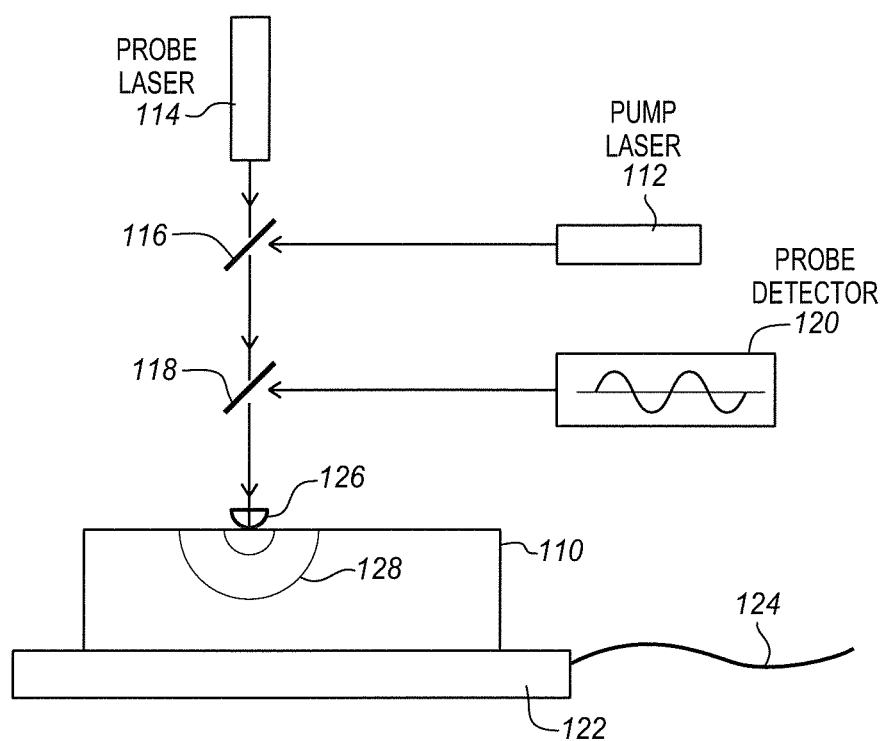
FIG. 1 is a diagram of an LVP test fixture using two lasers according to an embodiment.

FIG. 1 is a diagram of probing a chip using two lasers as described in more detail herein. A chip or die 110 is placed in a test fixture. In some embodiments, the die is attached as a flip chip to a package substrate 122 or test substrate which makes an electrical connection to a PCB (Printed Circuit Board) or to a test fixture. This connection is shown as a wire 124 for purposes of illustration but is typically through a PCB of a socket connector. The back side of the die and its circuitry is exposed to the probe system. A test system (not shown) coupled to the test wire 124 drives the die 110 to make the die, including the active region 128, active. By driving a clock or a test pattern through the die, the transistors are switched to allow or inhibit the flow of charge carriers through the die. It is this change in carrier flow that causes the modulation of the reflected light that will be detected at the probe laser detector 12.

A first laser 112 is a pump laser to illuminate the die and to increase the energy level of the illuminated area of the die. Any of a variety of energizing beams may be used. In some embodiments, the pump laser is in a visible light wavelength, for example in a range from about 670 nm to about 790 nm. A second laser 114 is a probe laser which illuminates the same location on the die. While the probe laser is typically at about 1200 nm, using visible light may allow higher resolutions to be obtained. In the illustrated example a first beam combiner 116 transmits the probe laser 114 without reflection to illuminate the die and reflects the pump laser to illuminate the same location. The combined beam is imaged onto an active region 128 within the die by a lens 126, such as a GaP or diamond SIL.

The light reflected from the active region 128 of the die 110 is reflected back into the lens 126 and up to a second beam combiner/splitter 118 to a photodetector 120 which detects changes in the light amplitude over time. The modulated reflected light as detected by the detector 120 is shown as a sine wave, however, the actual modulation in the reflected light will depend on many factors and can take different shapes. The second beam combiner/splitter 118 passes light from the pump laser and the probe laser directly to the die.

As shown, this pump-probe technique uses two different laser wavelengths. The first laser wavelength is to pump the system to an excited state thereby increasing the free carrier population and the second laser wavelength is to probe the system in its excited state. Additionally, if the die is not being powered for voltage probing, it is possible to optically image the device with just the visible wavelength beam in continuous operation with significant gains in spatial resolution.

In some embodiments a pump-probe system uses a 600 nm laser to excite the die and an 1120 nm laser to probe the die. In other embodiments, a 600 nm laser is used for both the pump and the probe. This may be done using one or two lasers. However, other frequencies may alternatively be used to suit different laser and lens types. Such frequencies may be used with a GaP SIL, or other suitable lens system, and thin silicon die layer. If the silicon over the active circuits are not thin enough, then the silicon may be thinned adjacent to or over the locations which are to be probed. In order to detect illumination changes in the GHz range, a high-speed IR detector, such as InGaAs, may be used to detect the 1200 nm reflected light. A high speed detector, such as Si, may be used to detect 600 nm reflected light. Imaging at such wavelengths provides improved spatial resolution.

The die may be probed with visible light in a variety of different ways. In one embodiment, the probe light is applied as a continuous wave (CW) and the pump light is modulated with the clock frequency. This pump light modulation produces a high level background signal that can be filtered out from an IR photodetector input. On the other hand, the continuous probe light provides a high quality signal mapping. For a simpler system, the pump light may be modulated at a much lower frequency. This allows for simpler filtering. For example, if the active region is modulated with a GHz clock, the pump light may be modulated with a KHz clock. This approach may also integrate well with the use of a LTM (Laser Timing Module) for waveform probing.

In another embodiment, the probe light is clocked with the pump light. The probe light and visible pump light can be offset by, for example, one half cycle. However it is difficult to precisely time the lasers and it requires a long time to acquire a steady signal. In another embodiment, the pump light and the laser light are continuous. This is easy to implement but produces more heat and increased current from visible light absorption. The heat and current may cause damage to the die and other components.

Any embodiment of laser probing with visible light is very difficult to implement. This is in part because of the difficulty in obtaining and constructing a good high speed, high bandwidth photodetector for visible light. In order to characterize the activity at an active region, such as a PN junction, the photodetector needs a sample rate at least as high as the clock speed at the junction. A higher sample rate will provide greater accuracy in characterizing the behavior at the junction. Five, ten, or more times higher sample rates are preferred. For a 1 GHz clock signal in the circuit, a 10 GHz or higher sample rate is preferred. As transistor clock frequencies increase, still higher frequency sample rates are needed. This limits the choice of photodetector materials. The photodetector is preferably operational through the silicon and through a GaP SIL. However, the SIL may also be formed of other suitable materials including industrial diamond. A thinned InGaAs photodetector may be used to scan through 700-800 nm of silicon but has difficulty with the light that is transmitted through a GaP SIL. Si and Ge photodetectors have been developed that may also or alternatively be used. While the wavelength of the pump light may be made longer, this reduces the signal return from a LTM waveform.

LVP (Laser Voltage Probing) relies heavily on the signal return from the plasma-optical effect, i.e. the change in the returned signal comes from free carrier modulation by current in a PN junction. With visible light, the energy from the laser is strongly absorbed by the die leading to as much as a 75% reduction in the modulation of the received signal. In the visible light range, the light reflected from an active region is modulated by the current through the active region, for example a PN junction, but the modulation is difficult to detect. An accurate interferometric detector may be required to obtain sufficient accuracy. The electro-absorption of a silicon semiconductor circuit has its highest peak in the near infrared light wavelengths. Some LVP technologies use the near infrared range for this reason. With the higher eV (electron Volt) energies in the visible light range, the change in absorption caused by current in the PN junction is less. As the eV energy increases with shorter wavelengths, the change in electro-absorption goes to zero.

LVP also relies on changes in the index of refraction (n) caused by current through an active region, such as a PN junction. However, in the visible light range, the change in n becomes negative. The change in n is proportional to the square of the wavelength ($\lambda^2$) so the detectable response at visible wavelengths is much lower than in the near infrared.

Visible light may be used to advantage in one way by using visible light for pumping the silicon circuit and infrared light for detection. Referring to FIG. 1, the modulated pump laser 112 may be configured to produce visible light to expose the intended area. The probe laser 114 and probe detector 120 would then be configured to operate in the near infrared. The visible wavelength pump light has a higher eV energy and will directly excite more free carriers. This produces a higher return signal to the photodetector in the infrared wavelengths.

In brief, while the observation and measuring is done in the infrared wavelengths, the response in n is greater from the higher energy visible wavelength pump light. Such an approach is useful both for NMOS (N-type Metal Oxide Semiconductor) and PMOS (P-type Metal Oxide Semiconductor) silicon semiconductor circuitry. In this embodiment, the visible wavelength light excites carriers within the PN junction that is being observed. This increases the free carrier concentration through induced electron-hole pairs. The signal from the infrared probe beam should accordingly increase due to enhancement of free carrier absorption from the additional conduction band electrons created via visible excitation.

The detector may also operate in the visible light spectrum. This allows voltage changes to be observed with more precise localization to a desired feature. The higher localization allows for smaller areas of reflected and emitted radiation within the IC (Integrated Circuit or die 110) to be isolated. Using a thinned back side and a detector that is particularly effective in the selected visible wavelength, the visible light from the IC may be observed and used to estimate voltage in the active region.

The die may be thinned only above active regions that will be probed. This may be done, for example, using selective etching. In order to improve the accuracy of the detection, the etched surface may then be polished in any of a variety of different ways. Local indentation, or dimpling, can be used to target specific regions of interest while maintaining an optically polished surface. Alternative preparation methods using pulsed laser etching or wet chemical etching methods can also thin the silicon to <1 µm. Any of a variety of different mechanical grinding and laser etching techniques may be used to form dimples. While a die may have a significant thickness of silicon on its back side, much of this is unnecessary after the die has been fabricated. The back side silicon can be etched as thin as 0.5 µm in spots without adverse effect. The much thicker back side in other areas keeps the die intact through thermal cycling and physical and mechanical stress.

FIG. 2A is a diagram of a semiconductor test system for a laser voltage probe test using two different illumination sources and a single detector. The diagram shows transmitted light from the lasers to a DUT. A visible light laser 210 produces a beam of laser light 212 which is directed to a polarizing beam splitter (PBS) 214. The beam splitter directs a portion of the laser beam to a photodetector 216. The photodetector measures the intensity of the received partial beam and supplies the measure to a controller 218. The controller is connected to a laser driver 220 and uses the information with other data to control the laser driver. The driver drives the outputs of the first and the second lasers.

The first laser produces light in the visible waveband and is used as a pump laser. As mentioned above, visible range light is more powerful as a pump light than infrared. The light may be about 600 nm although shorter and longer wavelengths may be used depending on the particular implementation.

The laser beam from the first laser passes through another PBS 222 which is used for redirecting light from the DUT. Since the laser beam has already been polarized by the first PBS, it passes through the second PBS with very little loss of light. The laser beam is then passed through a quarter wave plate 226 to convert the linear polarized laser beam to circular polarized light 228. The light may be left or right circular polarized, depending on the implementation and, in this case, is right hand circular polarized. The circular polarized first laser light is passed through a dichroic beam combiner that is transparent to light from the first laser and is directed through an objective lens 234 to impinge on the DUT 236.

A second laser 252 produces a second beam of laser light 254 which is directed to a third PBS 256. The beam splitter directs a portion of the laser beam to a photodetector 258. Like the photodetector for the first laser beam, this photodetector measures the intensity of the received partial beam and supplies the measure to the controller 218. Bandpass filters can be placed in front of the detectors to block light from the other laser source as needed. The controller uses the information in controlling one or more laser drivers 220. The two lasers may be controlled by the same or different drivers. The second laser may produce light in the infrared waveband or the visible waveband and is used as a probe laser. As mentioned above, infrared light has a larger amplitude response to current in an active region and is easier to use with existing equipment. However visible light with its shorter wavelength allows for more accurate positioning. As features become smaller, visible light is better able to distinguish between different circuit elements that are near each other in the IC. The visible light may be similar to the first laser in wavelength, for example about 600 nm. The infrared light may be about 1200 nm, although shorter and longer wavelengths may be used for both visible and infrared light depending on the particular implementation.

The laser beam from the second laser passes through another PBS. Since the laser beam has already been polarized by the third PBS 256, it passes through the fourth PBS 260 with very little loss of light. The laser beam is then passed through a quarter wave plate 264 to convert the linearly polarized beam to circular polarized light opposite the polarization of the first laser beam, in this case left hand circular polarized 266. The circular polarized first laser light is directed through the same objective lens 234 to impinge on the DUT 236.

The light of the first 212 and second 254 laser beams is combined together in a beam combiner to both impinge upon the same active region through the same objective lens. The first laser beam is transmitted straight through a dichroic beam combiner 230. The second laser beam is reflected from a minor 268 to the same dichroic beam combiner but on the opposite side of its internal interface and filter coating. As a result, it is reflected and the transmitted and reflected light are combined as a single beam. This single beam is directed to the objective. The objective is typically a SIL based on GaP or diamond, depending on the particular implementation. In this example, the two beams are circularly polarized in opposite directions and the combination and reflection within the dichroic beam combiner result in an elliptically polarized beam 232 for use with the SIL. The polarization states may be managed in any of a variety of different ways to provide the best results with the objective lens and the rest of the optical system.

The configuration of FIG. 2A represents one possible way to combine two lasers of different frequencies into a single objective to impinge upon the same point in a DUT. The particular combination and order of beam splitters and combiners may be modified and different components may be used instead. The illustrated use of linear and circular polarization to split and combine beams is also provided only as an example. Beams may be split or combined in other ways instead.

Figure 2B:
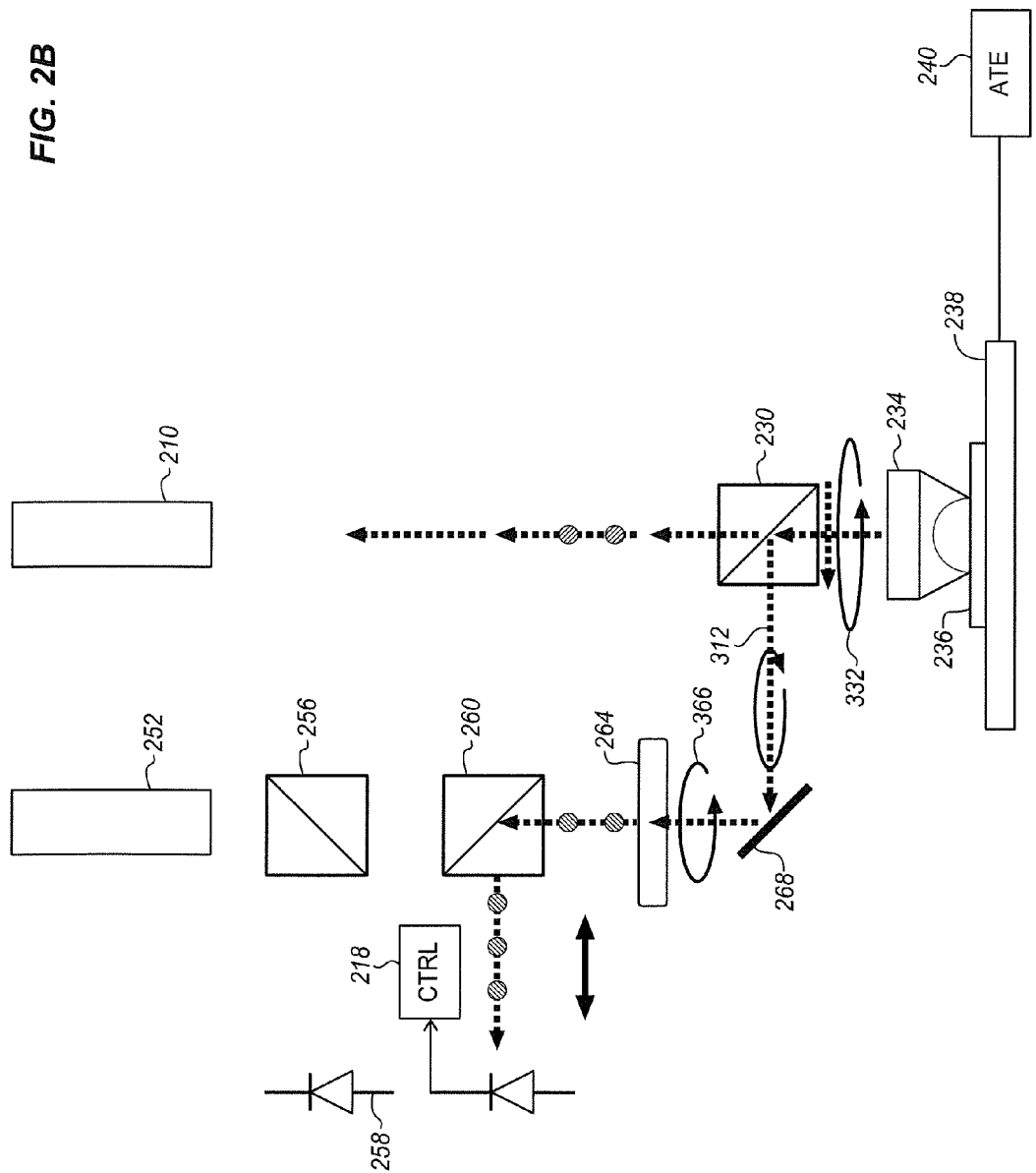
FIG. 2B is a diagram of received infrared light with the two laser LVP text fixture of FIG. 2A according to an embodiment.
Figure 2D:
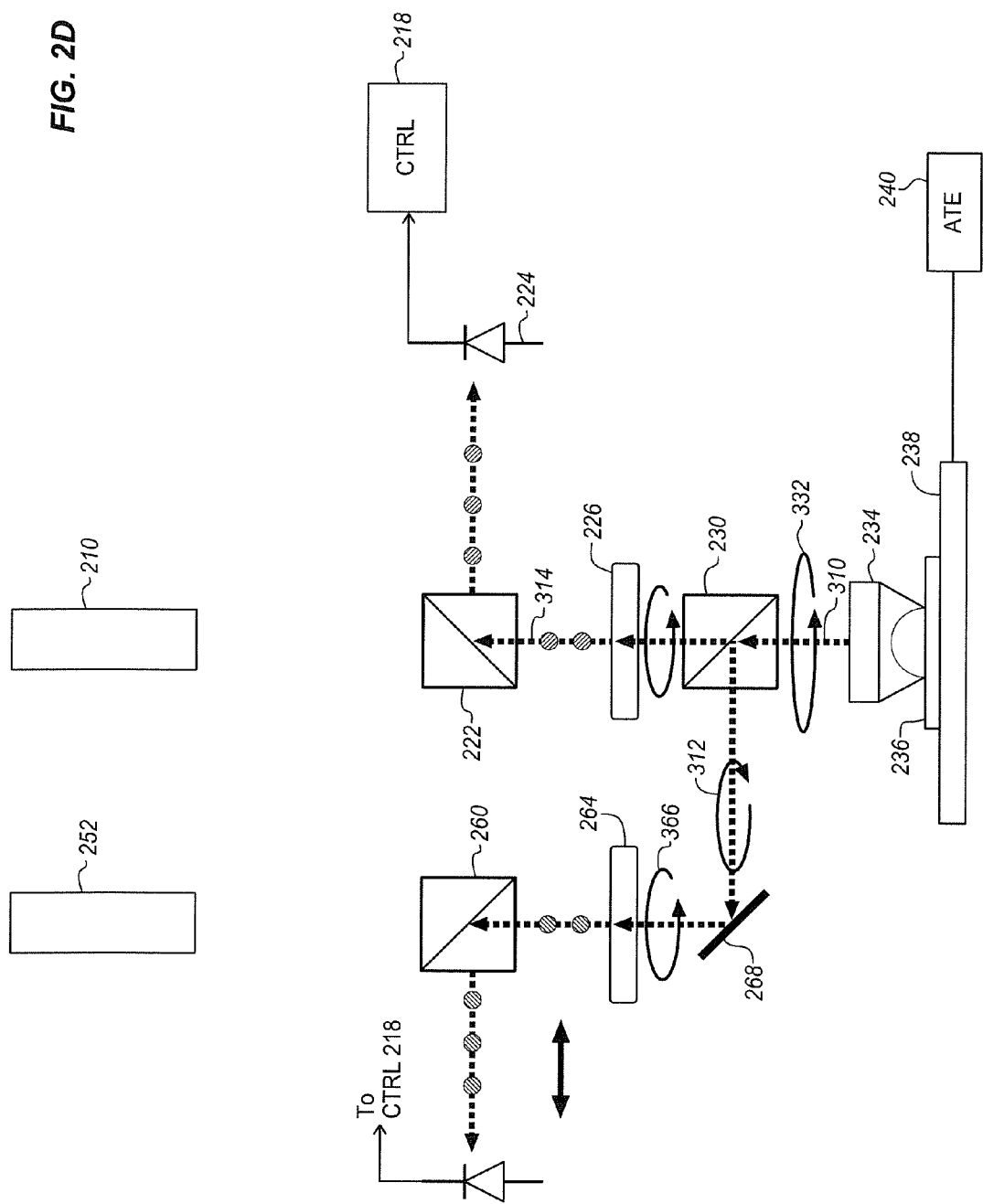
FIG. 2D is a diagram of received visible and infrared light with the two laser LVP test fixture of FIG. 2A according to an embodiment.

FIG. 2 also shows photodetectors 224, 262 to measure received radiation from the DUT. These are described in more detail in the context of FIGS. 2B, 2C, and 2D. The DUT 236 is shown as being attached to a PCB 238 which is coupled to an ATE (Automated Test Equipment) 240. The ATE drives the circuitry of the DUT in coordination with the controller 218 to perform laser voltage probe tests. The controller may be part of the ATE or controlled by the ATE or another agent (not shown) may be coupled to the controller and the ATE to coordinate the tests. In some embodiments, the DUT is a silicon die attached through a C4 (Controlled Collapse Chip Connection) pad to a package substrate. This allows the metal interconnect and routing layers on the top of the die to be connected directly to the substrate 238 exposing the back side or bottom of the die. The bottom of the die is silicon and doped silicon and is transparent to infrared and in part to visible light.

The configuration of FIG. 2A allows the laser beams to penetrate into the die substrate even when an IC is already on a package substrate, such as that of a flip chip-pin grid array (FC-PGA) integrated circuit (IC) package. In FC-PGA packaging, the land-side of a microelectronic die which contains the electrical interconnects is coupled to a carrier substrate with the land-side facing the carrier substrate. The backside of the microelectronic die is exposed as shown. The infrared laser can penetrate the backside of the substrate, which is semitransparent to infrared and near infrared light, as deep as 100 µm to illuminate an active region.

The objective lens is directed to the bottom side of the die to direct the laser beams into a selected active region through the silicon substrate on the bottom of the die. However, the invention is not so limited and different types of dies, die interconnects and objective lens configurations may be used.

The laser beams 212, 254 may be steered with steering mirrors (not shown) to enable the laser beams to scan at least an area of the IC 236. A three-axis translation system or any other system may be used to position the IC or the objective lens to provide a focused combined beam into the desired active region. The laser beams may be moved in a continuous pass across the IC from one device to the next while the IC output signals are measured. When the laser beams illuminate a defective IC device, then the ATE, by measuring current or voltage pin outputs, or by measuring the received radiation from the device, will indicate the flaw. Similarly, the change in amplitude of the probe beam can be mapped as the combined beam is scanned over the region of interest, generating a map of regions of high or low carrier activity at the clock frequency.

The controller may cause one or both lasers to produce continuous wave or pulsed beams. Electron-hole pairs are generated based upon the laser power coupled to the device and the laser wavelength. Photons with energy below the bandgap of the substrate generally produce heat at the target. Photons with energy at or above the bandgap energy of the substrate produce electron-hole pairs at the target in addition to heat. Therefore, a laser system can be used to provide the test signal to evaluate the IC devices using the methods described herein, electrically altering the IC device characteristics using either heat or electron-hole pairs.

FIG. 2B is a diagram of the system of FIG. 2A showing the propagation of the infrared light reflected from the DUT 236 back into the optical system. As the laser light is reflected, it propagates from the DUT 236 back through the SIL 234 to the dichroic beam combiner 230. However, in the reverse direction the beam combiner operates as a beam splitter to reflect the infrared light beam.

The light 310 from the DUT has an infrared component 312 that will be reflected by the dichroic beam combiner 230 to the minor 268 and then through the quarter wave plate 264. The light comes from the DUT with all colors as an elliptically polarized beam 332 but emerges from the dichroic beam combiner as circularly polarized light 366. The quarter wave plate renders it as linearly polarized so that when it hits the fourth polarizing beam splitter 260 it is reflected to an output photodetector 262. This photodetector is selected to be sensitive at high frequencies to the appropriate wavelengths selected by the dichroic prism 230. The measured light amplitude is sent to the controller 218 or ATE 240.

The illustrated system measures light at the infrared wavelengths. More wavelengths may be measured by appropriate design of the optical system. This may be used which may be used to determine the voltage in the active region being probed. The amplitude may be plotted over time and compared to the timing of input and clock signals in the active region. By using a visible wavelength pump light, the infrared probe light has a higher amplitude return and shows the reflection modulation more clearly. The infrared probe laser gains the benefit of a higher plasma-optical effect at that infrared probing wavelength. This provides a stronger absorption effect than does a visible light probe.

FIG. 2C is a diagram of the system of FIG. 2A showing the propagation of the visible light reflected from the DUT 236 back into the optical system. As the visible laser light is reflected, it propagates from the DUT 236 back through the SIL 234 to the dichroic beam combiner 230. However, in the reverse direction the dichroic beam combiner operates as a beam splitter to transmit the visible beam and reflect other wavelengths. The visible light emerges as a right hand circularly polarized beam 328, passes through the quarter wave plate 266 to become linearly polarized light 314 and then is reflected by the polarizing beam splitter 222 to the received light photodetector 224. The amplitude is measured and provided to the controller 218 or directly to the ATE 240 for analysis. The amplitude can be plotted over time to determine variations in the light output of the DUT in the active region.

By using visible light, at for example 600 nm, the illustrated system is able to provide the resolution benefits of 600 nm scaling, almost doubling the resolution compared to an infrared system up to the diffraction limits of the visible wavelengths.

FIG. 2D is a diagram of the system of FIG. 2A showing a two wavelength reflected light measurement system. As the laser light is reflected or absorbed and reemitted or both it propagates from the DUT 236 back through the SIL 234 to the dichroic beam splitter 230. The visible beam is transmitted the infrared is reflected. The visible light emerges as a right hand circularly polarized beam 328, passes through the quarter wave plate 266 to become linearly polarized light 314 and then is reflected by the polarizing beam splitter 222 to the received light photodetector 224. The amplitude is measured and provided to the controller 218 or directly to the ATE 240 for analysis. The amplitude can be plotted over time to determine variations in the light output of the DUT in the active region.

Similarly, the infrared light 312 is reflected by the dichroic beam combiner 230 to the mirror 268 and then through the quarter wave plate 264. It reflected by the beam splitter 260 to another output photodetector 262. The measured light amplitude is also sent to the controller 218 or ATE 240.

The illustrated system measures light at least at two different wavelengths. More wavelengths may be measured by appropriate design of the optical system. The amplitudes from the two photodetectors 224, 262 may be combined for a total amplitude. This may be used to determine the voltage in the active region being probed. The amplitude may be plotted over time and compared to the timing of input and clock signals in the active region. Alternatively, the two wavelengths may be analyzed separately or the system may use only one wavelength, as described above. The received infrared light shows a greater response to changes in the voltage in the active region, however, the visible light allows for higher spatial resolution for an observed active region. The visible beam alone can be used to generate an optical reflectance image with high spatial resolution, and the combined beams may be used for improved laser voltage probing By using visible light, at for example 600 nm, the illustrated system is able to provide the resolution benefits of 600 nm scaling, almost doubling the resolution of an infrared system up to the diffraction limits of the visible wavelengths. In addition, the visible wavelength energy pumping will directly excite more free carriers. The free carriers will provide a higher signal variation when detecting infrared light from the IC. The infrared detection can be combined with visible light detection for more accuracy in a variety of different tests. By observing at infrared wavelengths, the change in the refractive index provides a stronger signal. The infrared probe laser also gains the benefit of a higher plasma-optical effect at that infrared probing wavelength. This provides a stronger absorption effect than does a visible light probe.

Figure 3A:
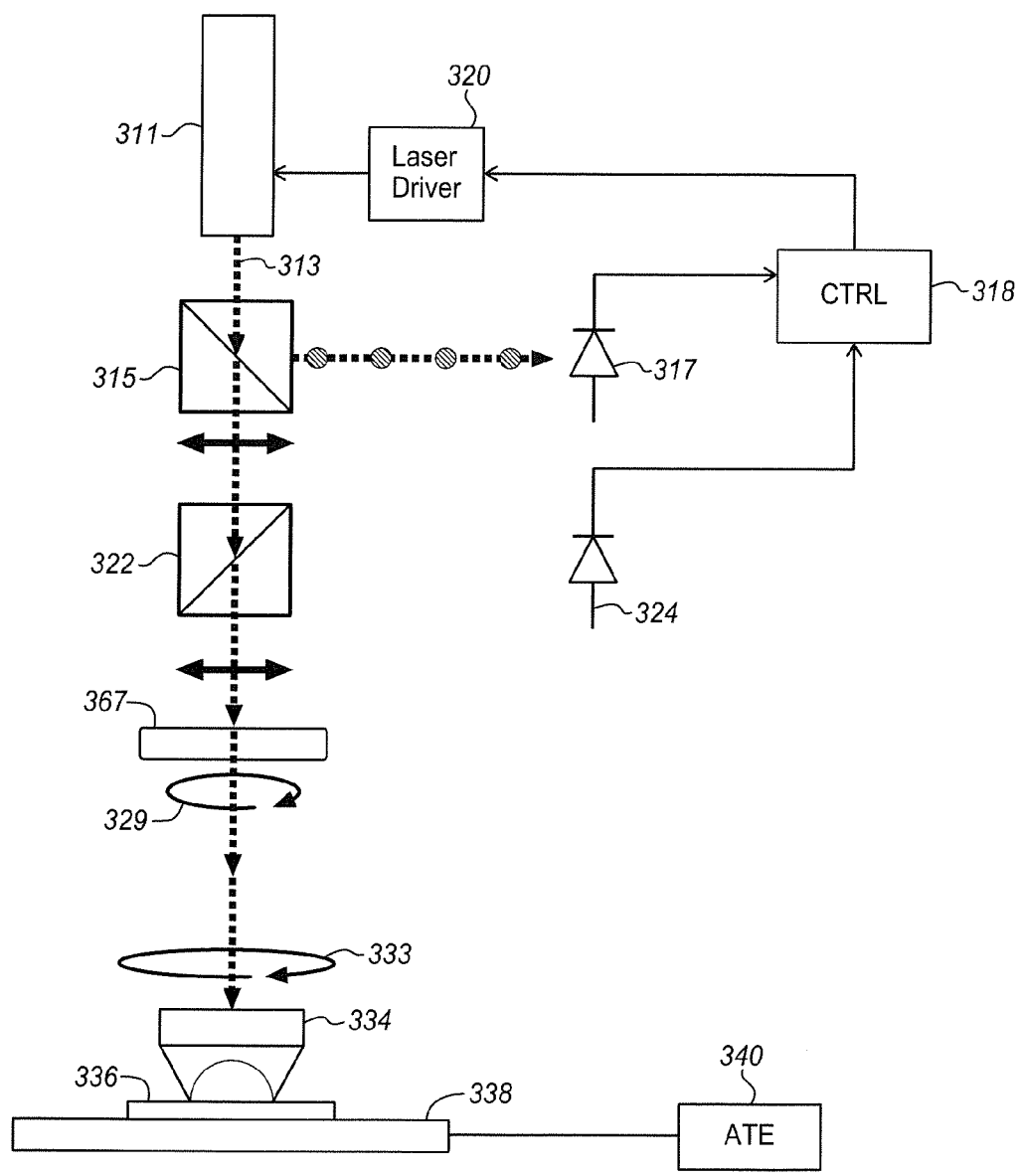
FIG. 3A is a diagram of transmitted visible light with a single laser LVP test fixture according to an embodiment.

FIG. 3A is a diagram of a semiconductor test system for a laser voltage probe test using only visible light. A single visible light laser 311 serves as the pump light and the probe light at the same time. The visible light laser 311 produces a beam of laser light 313 which is directed to a polarizing beam splitter (PBS) 315. The beam splitter directs a portion of the laser beam to a photodetector 317. The photodetector measures the intensity of the received partial beam and supplies the measure to a controller 318. The controller is connected to a laser driver 320 and uses the information with other data to control the laser driver. The visible band laser light may be about 600 nm although shorter and longer wavelengths may be used depending on the particular implementation.

The laser beam through another PBS 322 is used for redirecting light from the DUT. It passes through the second PBS then a quarter wave plate 367 to convert the linear polarized laser beam to circular polarized light 329, 333 and is directed through an objective lens 334 to impinge on the DUT 336.

The objective is specifically designed for visible light and, as mentioned above, may be a SIL based on GaP or diamond, depending on the particular implementation. As in the previous examples, the DUT 334 is coupled to a package 336, socket or other holder and connector. It is driven and controlled by ATE 340.

Figure 3B:
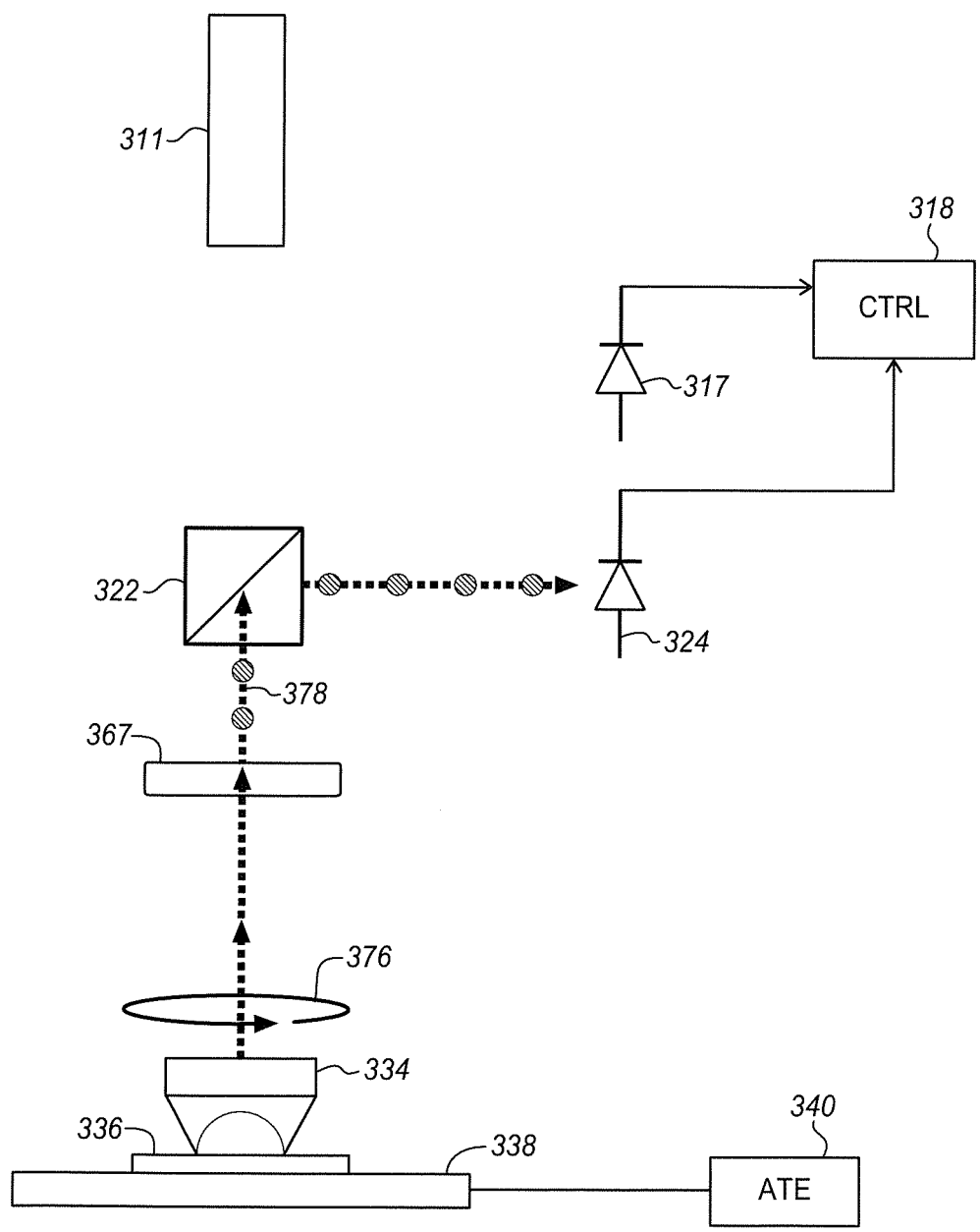
FIG. 3B is a diagram of received visible light with the single laser LVP test fixture of FIG. 3A according to an embodiment.

FIG. 3B is a diagram of the system of FIG. 3A showing the propagation of the visible light reflected from the DUT 336 through the SIL 334, as a right hand circularly polarized beam 376, through the quarter wave plate 367 to become linearly polarized light 378. It is then reflected by the polarizing beam splitter 322 to the received light photodetector 324. The amplitude is measured and provided to the controller 318 or the ATE 340. This system is much simpler and uses visible light for both illumination and reflectance. This allows for higher resolution analysis as described above. The visible beam alone is used as a probe for signal modulation and local probing as well.

Figure 4:
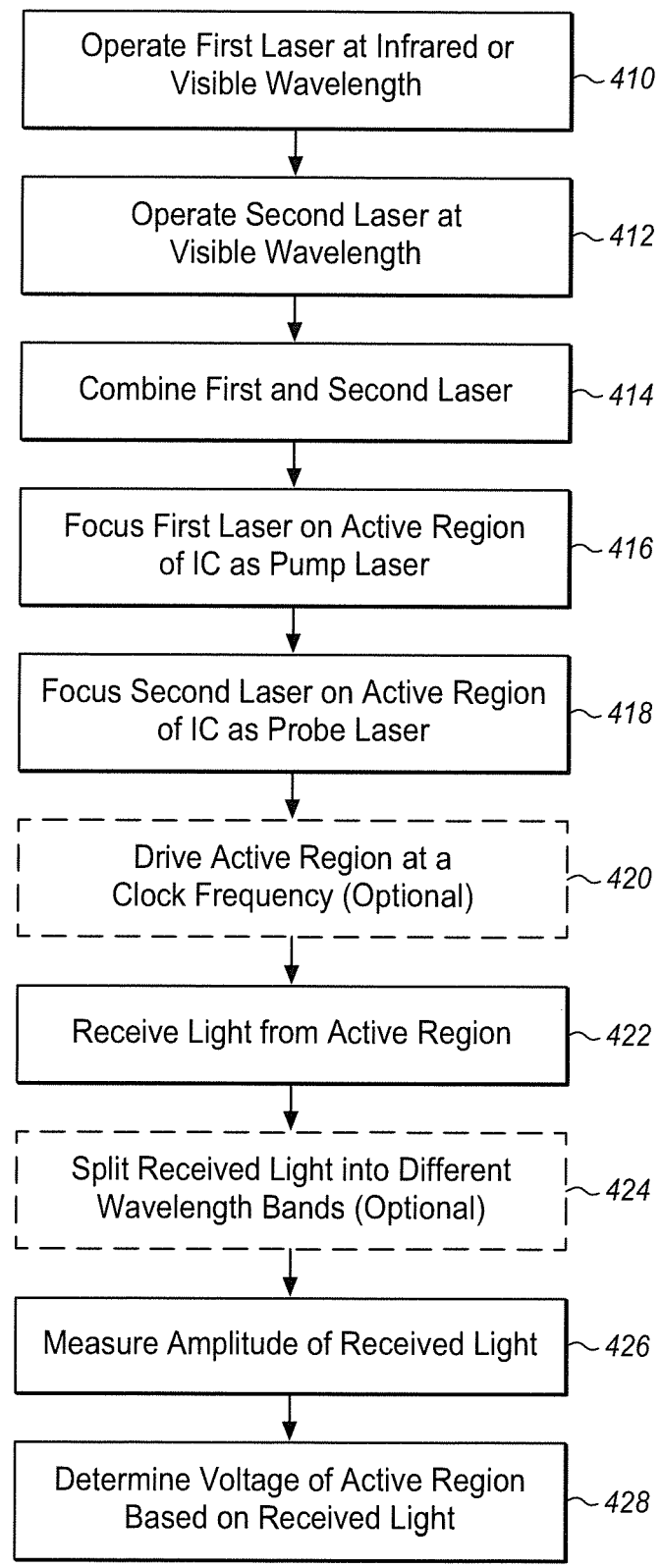
FIG. 4 is a process flow diagram of detecting a voltage at an active region of an integrated circuit according to an embodiment.

FIG. 4 is a process flow diagram of detecting a voltage at an active region of an integrated circuit (IC). The process starts at 410 with operating a first laser beam at an infrared or a visible wavelength depending on the particular implementation the infrared wavelength is longer than the visible wavelength. At 412, a second laser beam is operated at a visible wavelength. At 414, the first and second laser beams are combined and at 416, 418, the combined beams are focused on an active region of the IC. The first laser is operated as a probe laser and the second laser is operated as a pump laser, although the second laser may also be operated as a probe laser. This laser light is directed to the active region by an objective lens through the silicon to the active region. The objective lens may be a solid immersion lens, however, the invention is not so limited.

At 420, the active region is optionally driven at some clock frequency by, for example, automated test equipment or another test fixture. The pump laser may be modulated at the same frequency either synchronized with the active region clock or delayed by half cycle. Alternatively, the pump laser may be operated once per test loop cycle and swept though a finite time range. Alternatively, the pump laser may be driven as a continuous beam. The probe laser may also be a continuous beam.

The light injected into the active region is partially absorbed by the active region and partially reflected. The amplitude of this light is modulated as a result of current flowing through the active region. At 422, light is received from the active region of the IC through the back side of the IC at a detector. The light may be applied to a beam splitter at 424. In the illustrated examples, the two wavebands correspond to the wavebands of the two laser beams. The two wavebands may be a visible band and an infrared band. The wavebands may be two different visible bands or two different infrared. Alternatively and as in FIG. 1, a single waveband may be used.

At 426, the amplitude of the received light is measured for one or more wavebands. This amplitude is then used at 428 to determine a voltage of the active region. The determination may be made by relating the amplitude modulation of the received light to the electric field in the active region.

Figure 5:
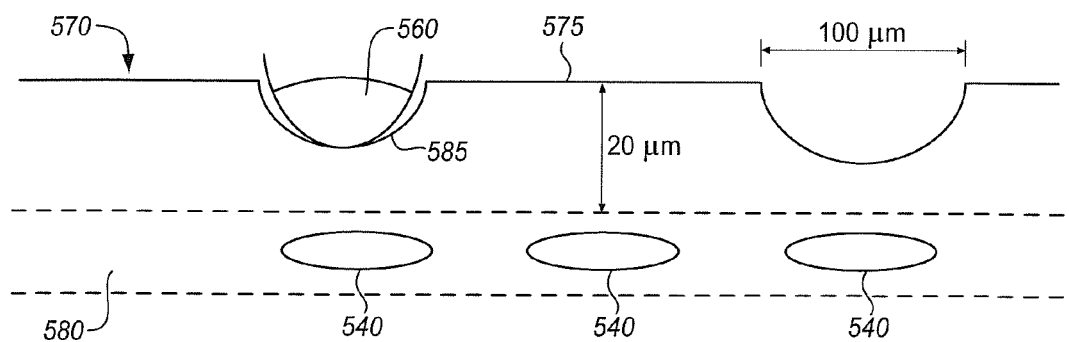
FIG. 5 is a diagram of a cross-section of a portion of the backside of a silicon die undergoing LVP according to an embodiment.

FIG. 5 is a diagram of a cross-section of a portion of the backside of a silicon die suitable for laser voltage probing using visible light. The die 570 has embedded integrated circuitry 580 that has been formed over the backside 575 of the die which served as a substrate. The substrate is 10 to 30 μm thick over the circuitry layers. Within the circuitry, the designers have selected several active regions 540 of the IC as suitable for laser voltage probe testing. There may be metal areas 545 within or near the active regions. The metal areas allow the direct reflection of light back into the laser probe test apparatus. The reflected light may be compared to the active region light to determine modulation of the active region light. The silicon die backside can be 500 to 1000 µm thick or more and typically about 700 µm. This may be planar polished to remove almost all of the backside after the die is finished. So that 100 to 1000 µm of silicon may be removed leaving 10-100 µm of die backside.

Dimples 550 are etched over these active regions to thin the back side of the IC. For typical FC-PGA chips, the dimples may be about 100 µm across and have a roughly circular cross section. However, the particular dimensions may vary depending on the particular chip and testing equipment. The dimples reduce the distance that the laser light must travel through the silicon backside to reach the corresponding active region. While silicon is fairly transparent to infrared light, it absorbs most of visible light beam. The dimple reduces the attenuation of the visible light beam by reducing the distance that the light must travel from the objective to the active region. In another embodiment, the back side of the IC adjacent the active region is thinned by about 100 to 1000 µm before focusing the first and second laser beams on the active region through the back side of the IC. For visible light, the die may be thinned to below about 50 nm throughout or only in parts.

The dimples may be formed by etching and then by mechanical polishing. Any of a variety of different dimpling tools for electron microscopy and failure analysis preparation, may be used. In one type of tool, two orthogonally rotated wheels are used to apply pressure to a highly local area of the device. The dimpling rate is controlled by changing the load force, rotation speed, and size of polishing slurry particles. The result is a polished surface in a local region perhaps as large as 100 µm×100 µm. This leaves less than 1 µm of backside silicon for example 20-50 nm.

In some embodiments, the dimples may be formed to correspond roughly to the shape of a biconvex objective lens of a particular type of SIL. During use, a SIL is typically placed in direct contact with the silicon surface of the backside of a die. If the dimple has a diameter of about 100 µm and a radius of curvature of about 30 mm, then the shape of the dimple will correspond to roughly the shape of an objective lens 560 of some SIL types. This allows the SIL to be brought into direct contact with the bottom of the dimple. A larger dimple may be used to ensure that the SIL fits. The smaller dimple allows more of the silicon backside to be preserved. This provides greater structural integrity to the die.

Figure 6:
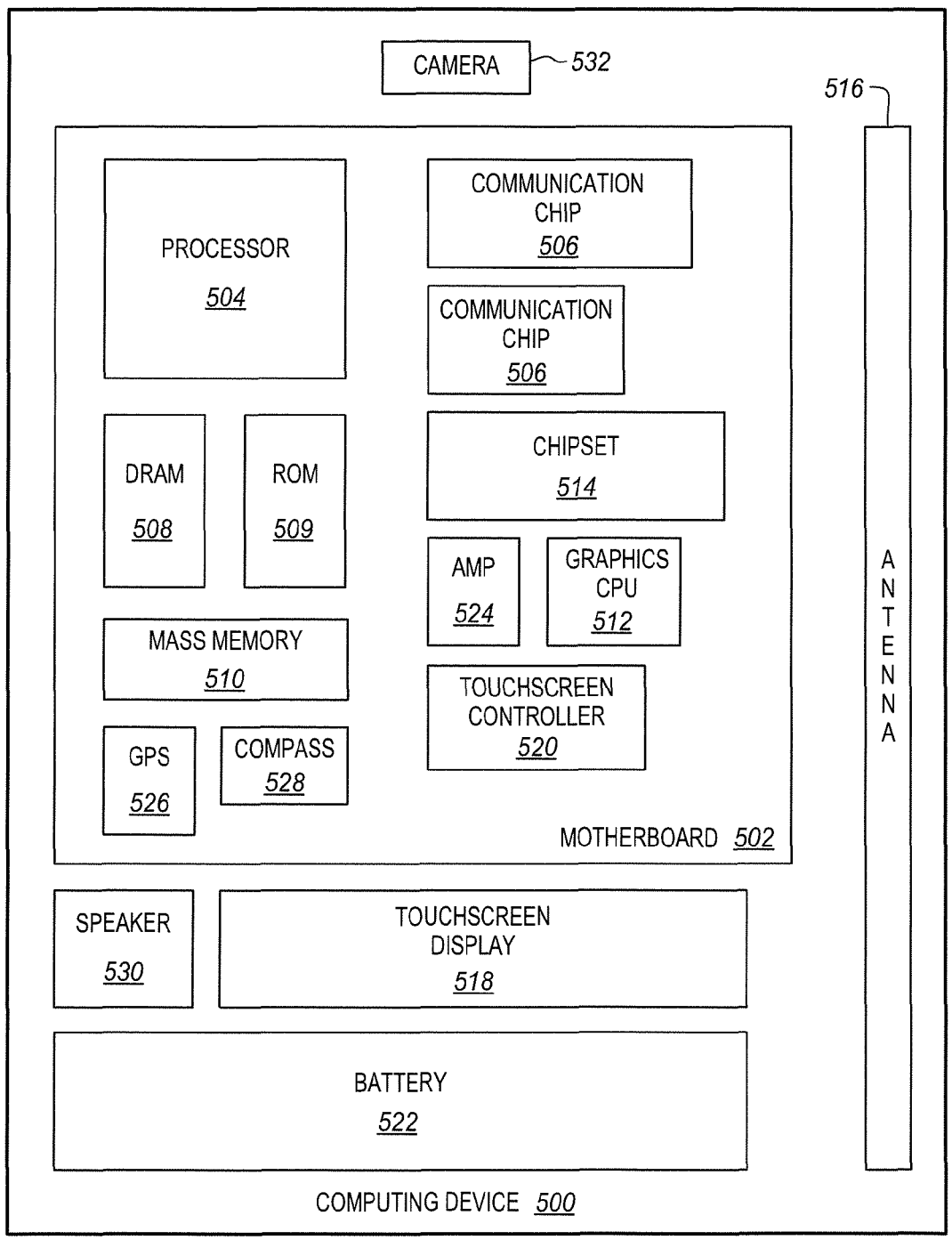
FIG. 6 is a block diagram of a computing device incorporating a tested semiconductor die according to an embodiment.

FIG. 6 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged together using a multiple level redistribution layer, if desired. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to method for detecting a voltage at an active region of an integrated circuit (IC). The method includes operating a laser beam at a visible wavelength, focusing the laser beam through a back side of the IC on an active region of the IC, receiving light from the active region through the back side of the IC at a detector, and determining a voltage of the active region based on the received light.

Some embodiments include detecting an amplitude modulation of the received light and relating the amplitude modulation to the electric field in the active region. Some embodiments include receiving light through a GaP solid immersion lens. Some embodiments include receiving only light of the visible wavelength of the laser beam. Some embodiments include thinning the back side of the IC adjacent the active region by about 100 to 1000 µm before focusing the laser beam on the active region through the back side of the IC.

In some embodiments the semiconductor comprises silicon. In some embodiments the active region comprises an N diffusion region disposed within a P substrate. In some embodiments the semiconductor is comprised in a fully packaged integrated circuit. In some embodiments the fully packaged integrated circuit is a control collapse chip connection mounted integrated circuit.

Some embodiments include operating a second laser beam at an infrared wavelength longer than the visible wavelength, and combining the first and second laser beams, wherein focusing comprises focusing the first and second combined laser beams. In some embodiments the first laser beam is a pump laser to excite the active region of the IC. In some embodiments, the second laser beam is a probe laser, the reflection of which is detected. Some embodiments include driving the active region at a clock frequency, wherein the pump laser is modulated at the clock frequency, and wherein the probe laser is driven with a continuous wave. Some embodiments include driving the active region at a clock frequency, wherein the pump laser is modulated frequency much lower than the clock frequency, and wherein the probe laser is driven with a continuous wave.

In some embodiments the pump laser and the probe laser are driven with a continuous wave. Some embodiments include receiving only light of an infrared wavelength. In some embodiments include the infrared wavelength is the same as the wavelength of the first laser beam. Some embodiments include receiving a reflection of the first laser beam from a front side metal disposed near the active region and wherein determining a voltage comprises comparing the received light from the active region to the received light from the front side metal.

Some embodiments include receiving only light of a visible wavelength. Some embodiments include forming a dimple on the back side of the IC to reduce the thickness of the back side of the IC over the active region. Some embodiments include thinning the back side of the IC to reduce the thickness of the back side of the IC over the active region.

Some embodiments pertain to a method for detecting a voltage at an active region of an integrated circuit (IC). The method includes operating a first laser beam at a visible wavelength, operating a second laser beam at an infrared wavelength longer than the visible wavelength, combining the first and second laser beams, focusing the first and the second laser beams through a back side of the IC on an active region of the IC, receiving light from the active region through the back side of the IC at a detector, and determining a voltage of the active region based on the received light.

Some embodiments include receiving only light of a visible wavelength. Some embodiments include receiving light through a GaP solid immersion lens.

Some embodiments pertain to a device for detecting an electric field in an integrated circuit (IC). The method includes a laser configured to provide a laser beam at a visible wavelength, an objective lens positioned in front of the laser to focus the laser beam on an active region of an integrated circuit through a back side of the IC, and a detector positioned to receive a reflected laser beam reflected from the active region through a back side of the IC, through the objective lens, the detector configured to detect an amplitude modulation of the reflected laser beam, and wherein the amplitude modulation is attributable to the electric field at the active region.

In some embodiments the amplitude modulation is further attributable to photo-absorption and reflectance modulation of the laser beam in the active region. Some embodiments include a test driver to drive the active region at a clock frequency. Some embodiments include a drive circuit to drive the laser at the clock frequency. In some embodiments the objective lens is a GaP solid immersion lens.

Some embodiments include a second laser configured to provide a laser beam at an infrared wavelength, and a beam splitter positioned between the first and second lasers and the objective lens to combine the first and second laser beams, wherein the objective lens is to focus the first and the second laser beams. In some embodiments the beam splitter is a polarizing beam splitter, the device further including a half wave plate and quarter wave plate, the polarizing beam splitter positioned between the half wave plate and the quarter wave plate.

Some embodiments include test driver to drive the active region at a clock frequency and to drive the second laser with a continuous wave. In some embodiments the detector comprises an infrared detector or the detector comprises a visible light detector.

What is claimed is:

1. A method for detecting a voltage at an active region of an integrated circuit (IC), the method comprising:
    operating a laser beam at a visible wavelength;
    focusing the laser beam through a back side of the IC on an active region of the IC, the back side being opposite a front side, the front side having the active region and metal routing layers;
    receiving light of the laser beam from the active region of the front side through the back side of the IC at a detector; and
    determining a voltage of the region of the front side based on the received light.

2. The method of claim 1, wherein determining a voltage comprises detecting an amplitude modulation of the received light and relating the amplitude modulation to an electric field in the active region.

3. The method of claim 1, wherein receiving light comprises receiving light through a GaP solid immersion lens.

4. The method of claim 1, wherein receiving light at the detector comprises bandpass filtering for receiving only light of the visible wavelength of the laser beam.

5. The method of claim 1, further comprising thinning the back side of the IC adjacent the active region by about 100 to 1000 μm before focusing the laser beam on the active region through the back side of the IC.

6. The method of claim 1, wherein the laser beam is a first laser beam, the method further comprising:
    operating a second laser beam at an infrared wavelength longer than the visible wavelength; and
    combining the first and second laser beams, wherein focusing comprises focusing the first and second combined laser beams.

7. The method of claim 6, wherein the first laser beam is a pump laser to excite the active region of the IC and the second laser beam is a probe laser, the reflection of which is to be detected.

8. The method of claim 7, further comprising driving he active region at a clock frequency, wherein the pump laser is modulated at a frequency much lower than the clock frequency, and wherein the probe laser is driven with a continuous wave.

9. The method of claim 6, wherein receiving light at the detector comprises bandpass filtering for receiving only light of an infrared wavelength.

10. The method of claim 6, wherein receiving light at the detector comprises bandpass filtering for receiving only light of a visible wavelength.

11. The method of claim 10, further comprising for line a dimple on the back side of the IC to reduce the thickness of the back side of the IC over the active region.

12. The method of claim 10, further comprising thinning the back side of the IC to reduce the thickness of the back side of the IC over the active region.

13. A device for detecting an electric field in an integrated circuit (IC), the method comprising: a laser configured to provide a laser beam at a visible wavelength; an objective lens positioned in front of the laser to focus the laser beam on an active region of an integrated circuit through a back side of the IC, the back side being opposite a front side, the front side having the active region and metal routing layers; and, a detector positioned to receive a reflected laser beam reflected from the active region of the front side through a back side of the IC, through the objective lens, the detector configured to detect an amplitude modulation of the reflected laser beam, and wherein the amplitude modulation is attributable to the electric field an the active region of the front side.

14. The device of claim 13, wherein the amplitude modulation is further attributable to photo-absorption and reflectance modulation of the laser beam in the active region.

15. The device of claim 13, further comprising a test driver to drive the active region at a clock frequency.

16. The device of claim 13, wherein the objective lens is a GaP solid immersion lens.

17. A device for detecting an electric field in an integrated circuit (IC), the method comprising a first laser configured to provide a laser beam at a visible wavelength; a second laser configured to provide a laser beam at an infrared wavelength; an objective lens positioned in front of the first and second laser to focus the first and second laser beams on an active region of an integrated circuit through a back side of the IC, the back side being opposite a front side, the from side having the active region and metal routing layers; a beam splitter positioned between the first and second lasers and the objective lens to combine the first and second laser beams; a detector positioned to receive a reflected laser beam reflected from the active region of the front side through a back side of the IC, through the objective lens, the detector configured to detect an amplitude modulation of the reflected laser beam; and a test driver to drive the active region of the front side at a clock frequency and to drive the second laser with a continuous wave, wherein the amplitude modulation is attributable to the electric field at the active region.

18. The device of claim 17, wherein the beam splitter is a polarizing beam splitter, the device further comprising a half wave plate and quarter wave plate, the polarizing beam splitter positioned between the half wave plate and the quarter wave plate.

19. The device of claim 17, wherein the detector comprises an infrared detector.

20. The device of claim 17, wherein the detector comprises a visible light detector.

* * * * *